(12) United States Patent
Straussnigg et al.

(10) Patent No.: US 7,576,673 B2
(45) Date of Patent: Aug. 18, 2009

(54) INCREASING THE DYNAMIC RANGE OF PULSE WIDTH MODULATION IN ANALOG TO DIGITAL CONVERTERS

(75) Inventors: Dietmar Straussnigg, Villach (AT); Andreas Wiesbauer, Portschach (AT); Luis Hernandez, Madrid (ES); Susana Paton Alvarez, Madrid (ES)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/948,206

(22) Filed: Nov. 30, 2007

(65) Prior Publication Data

US 2009/0140904 A1   Jun. 4, 2009

(51) Int. Cl.
*H03M 3/00* (2006.01)

(52) U.S. Cl. .................. 341/143; 341/118; 341/120; 341/139; 341/155; 341/157

(58) Field of Classification Search ............ 341/143, 341/118–122, 139, 155, 157
See application file for complete search history.

(56) References Cited

U.S. PATENT DOCUMENTS

| | | | |
|---|---|---|---|
| 6,448,915 B1 * | 9/2002 | Logue | 341/143 |
| 6,684,115 B1 * | 1/2004 | Cheng | 700/45 |
| 6,801,148 B2 * | 10/2004 | Freeman et al. | 341/143 |
| 7,315,269 B2 * | 1/2008 | Schreier et al. | 341/143 |
| 7,365,668 B2 * | 4/2008 | Mitteregger | 341/143 |
| 7,405,687 B2 * | 7/2008 | Mitteregger et al. | 341/143 |
| 7,436,336 B2 * | 10/2008 | Vadipour | 341/143 |
| 7,443,324 B1 * | 10/2008 | Muhammad | 341/131 |
| 2002/0171572 A1 * | 11/2002 | Yamamoto | 341/143 |
| 2006/0109135 A1 * | 5/2006 | Donat et al. | 340/686.6 |
| 2006/0187099 A1 * | 8/2006 | Fujimoto | 341/143 |
| 2007/0035426 A1 * | 2/2007 | Schreier et al. | 341/143 |
| 2007/0069933 A1 * | 3/2007 | Clara et al. | 341/143 |

OTHER PUBLICATIONS

Gaalaas et al, "Integrated Stereo Delta-Sigma Class D Amplifier," 2005 IEEE International Solid-State Circuits Conference, 2005, pp. 120-121, 588.

* cited by examiner

*Primary Examiner*—Linh V Nguyen
(74) *Attorney, Agent, or Firm*—Lee & Hayes, PLLC

(57) ABSTRACT

This disclosure relates to adjusting a limit cycle frequency of a pulse width modulation in an analog to digital converter as a function of an input signal level to increase dynamic range.

19 Claims, 6 Drawing Sheets

INCREASING THE DYNAMIC RANGE OF PULSE WIDTH MODULATION IN ANALOG TO DIGITAL CONVERTERS

BACKGROUND

This application relates to generating a pulse width modulated signal using an analog to digital converter and more specifically to increasing the dynamic range of a pulse width modulator when sampling an incoming signal using an analog to digital converter.

Pulse width modulation in analog to digital converters is used in a variety of applications, such as audio amplification and power regulators. Such analog to digital converters (ADC) have the characteristics of being non-linear as the voltage level of the analog input signal increases. This results in an increase in the signal to noise ratio of the output of the ADC being reduced at higher input voltage levels. Increasing the signal to noise ratio effectively lowers the usable dynamic range of the ADC.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Figure 1:
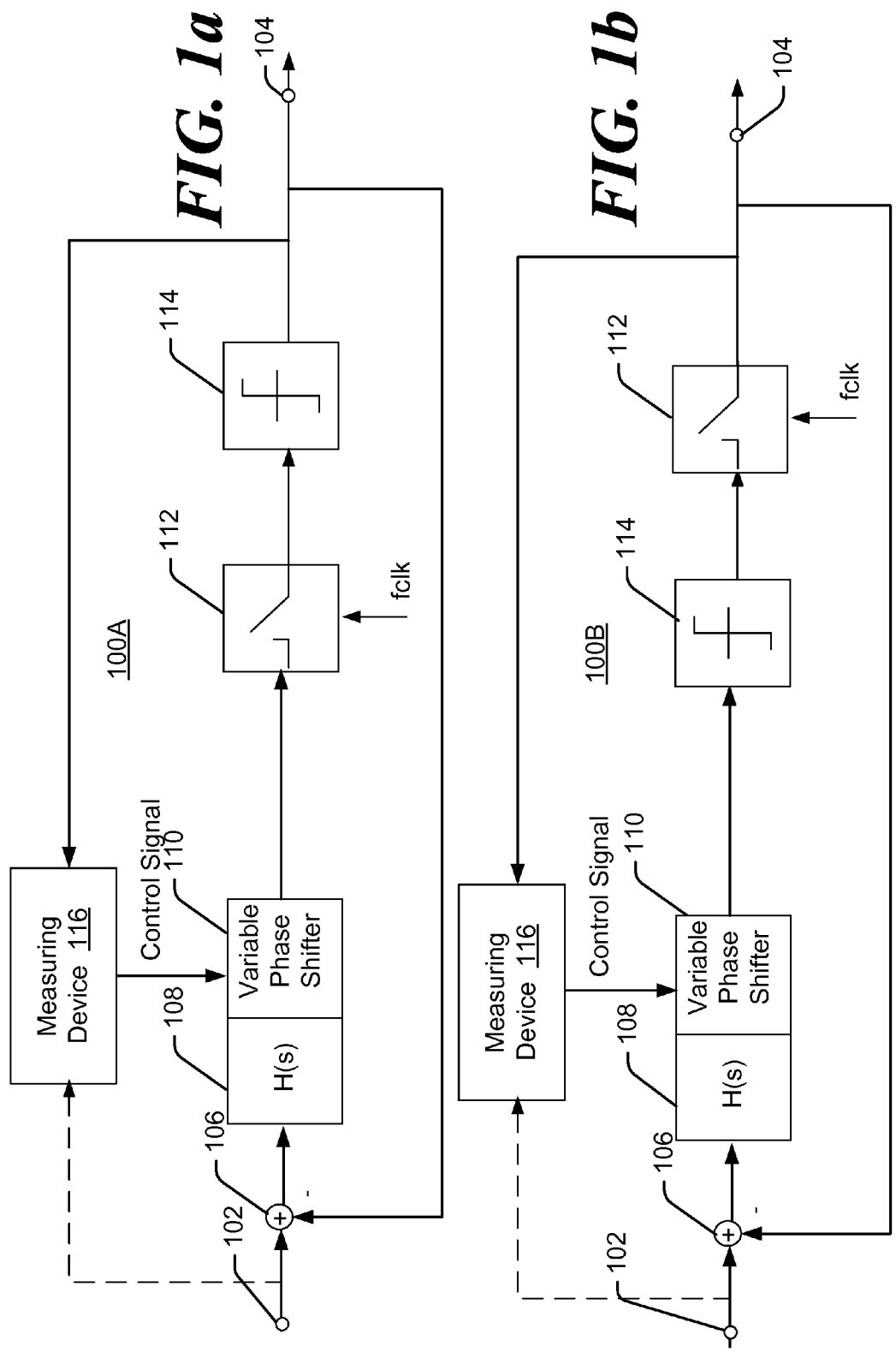
FIGS. 1a and 1b are simplified schematic diagrams of various embodiments of an analog to digital converters (ADC) with a comparator and a sampler circuit, respectively, being disposed in a final stage of the ADC.

Disclosed herein are techniques for adjusting a limit cycle frequency of a pulse width modulation in various analog to digital converters. In one described implementation, an analog to digital converter (ADC) is provided with an input terminal and an output terminal. An analog input signal is received on the input terminal. The pulse width modulated analog to digital converter circuit includes a plurality of stages connected in series. The stages receive an input signal and generate an output signal. The output signal from the last stage is fed to the output terminal and is combined with the received input signal provided on the input terminal. The combined signal is fed to a first of the stages. At least one of the stages includes a variable delay stage to generate a delayed signal by delaying the input signal for a first predetermined time interval when a level of the input signal exceeds a first predetermined level. The stage also delays the input signal for a second predetermined time interval when the level of the input signal exceeds a second predetermined level. Delaying the input signal results in a change in the cycle frequency of the ADC.

According to another implementation, a method is provided for increasing a dynamic range of a pulse width modulation in an analog to digital converter by adjusting the ADC cycle frequency as a function of an input analog signal level.

The techniques described herein may be implemented in a number of ways. For example although only two levels are detecting with the measuring device, the disclosed embodiment in not limited two detecting two levels and more than two levels may be detected. One example environment and context is provided below with reference to the included figures and on going discussion.

Exemplary Systems

FIGS. 1-4 show implementations to increase a dynamic range of pulse width modulation in an analog to digital converter (ADC), e.g. ADCs 100A, 100B, 200, 300 and 400. Each ADC includes an input terminal 102, an output terminal 104 and a plurality of stages coupled between input terminal 102 and output terminal 104. Each ADC converts an analog input signal received on terminal 102 to a corresponding pulse width modulated digital signal where with the width of each pulse is related to the amplitude of the input voltage level.

Stages include a lowpass filter stage 108 (also referred to herein as a "lowpass filter"), a variable phase shifter stage 110 (also referred to herein as a "variable phase shifter"), a sampler circuit stage 112 (also referred to herein as a "sampler circuit") and a comparator circuit stage 114 (also referred to herein as a "comparator circuit"). Stages 108, 110, 112 and 114 each have an input and an output. The input of each stage is connected to the output of the previous stage and the output of each stage is connected to the input of the next stage. However, the input to the first stage is connected to the output of the combiner circuit 106 and the output of the last stage is connected to the combiner circuit 106 and output terminal 104. The variable phase shifter 110 is controlled by a measuring device 116. The ADCs are described herein as including stages 108-114; however, the order and arraignment of the stages varies.

FIGS. 1a and 1b show ADC 100A and 100B respectively with a combiner circuit 106 connected to input terminal 102 and output terminal 104. The output of combiner circuit 106 is connected to variable phase shifter 110 via low pass filter 108. In FIG. 1a, variable phase shifter 110 is connected via sampler circuit 112 and comparator circuit 114 to output terminal 104. In FIG. 1b, variable phase shifter 110 is connected via comparator circuit 114 and sampler circuit 112 to output terminal 104. In FIG. 1b, comparator circuit 114 is the final stage of ADC 100A, and in FIG. 1b, sampler circuit 112 is the final stage of ADC 100B.

Figure 3:
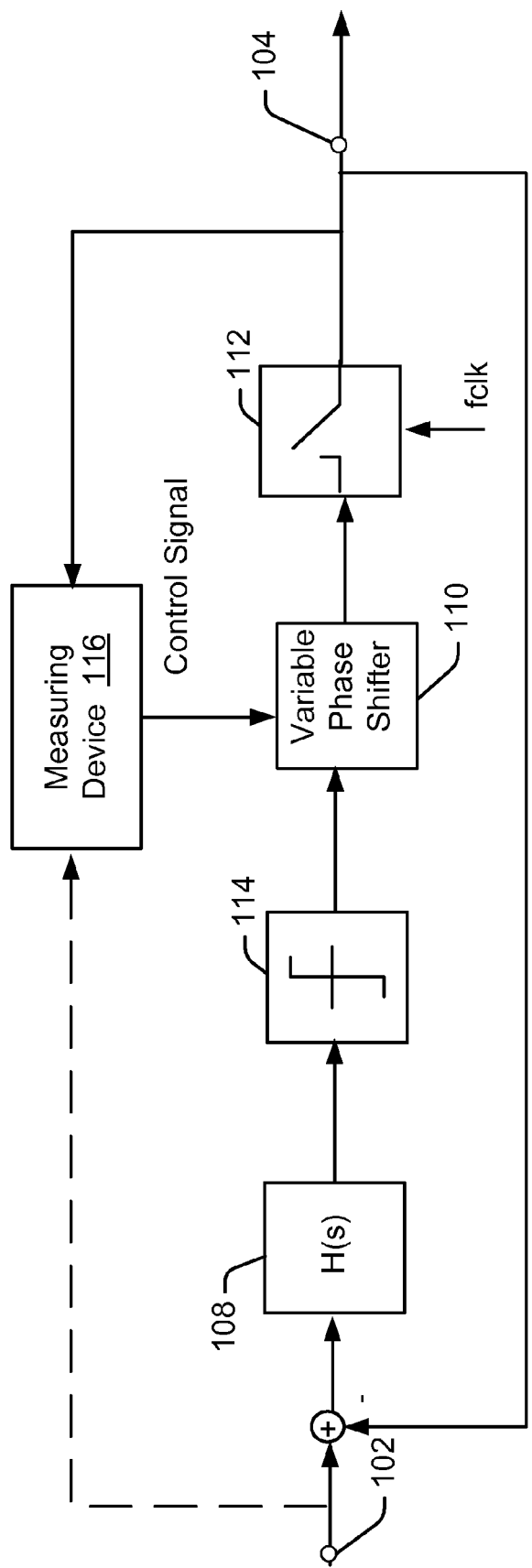
FIG. 3 is a simplified schematic diagram of one embodiment of an analog to digital converter with the variable phase shifter 110 being connected to the sampler circuit in the final stage of the ADC.
Figure 4:
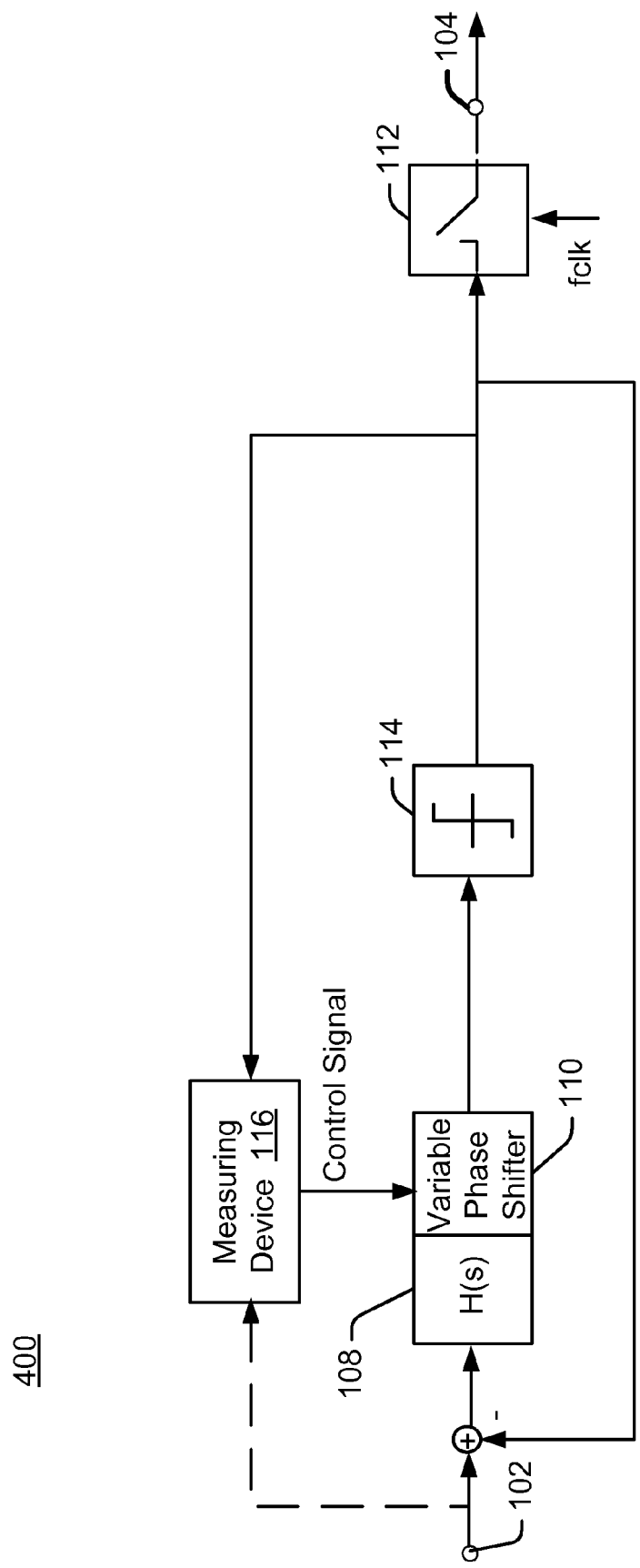
FIG. 4 is a simplified schematic diagram of one embodiment of an analog to digital converter having a comparator being inside a feedback loop and being connected to a sampler circuit in the final stage of the ADC.

Combiner circuit 106 combines, by summing, a voltage level of an analog input signal received on input terminal 102 with a voltage level of the inverse of the voltage level output provided by the last stage to output terminal 104 (in FIGS. 1-3), or provided by a last stage prior to the sampler circuit 112 (FIG. 4).

Low Pass Filter 108 filters out or attenuates high frequency signals above a predetermined frequency. The cutoff frequency of filter 108 is determined by the bandwidth of the transmission system. The cutoff frequency is typically much lower than the sampling rate of the sampler.

Variable phase shifter 110 changes the delay time of signals being transferred from shifter's 110 input to output based on an indicator contained in control signals received from measuring device 116. Measuring device 116, also generally known as a quantizer, monitors the analog input signal on input terminal 102, or may monitor the corresponding pulse width modulated digital output signal supplied to output terminal 104, to determine if the voltage level of the input signal exceeds one or more predetermined threshold levels. Although this specification describes the measuring device 116 determining whether the input signal has exceed a first or a second threshold level, the measuring device 116 is not limited to monitoring two levels but may monitor the input signal to determine if it has exceeded any number of threshold levels. Further, the variable phase shifter 110 may be described herein as providing a predetermined first or second delay time intervals; however, the variable phase shifter 110 may likewise be configured to provide any number of delay time intervals.

The measuring device 116, upon determining that the input signals analog voltage level has exceeded a first voltage level, dynamically provides a control signal to variable phase shifter 110 to reduce a delay time interval of signals passing through phase shifter 110. Adding or reducing a delay to the variable phase shifter 110 changes the ADC limit cycle frequency. Upon the input signals voltage level exceeding a second voltage level, the measuring device 116 provides a control signal to variable phase shifter 110 to further reduce its delay time interval. As the voltage level of the signal drops below the second voltage level, the measuring device 116 provides a control signal to variable phase shifter 110 to increase its delay time interval. Finally, if the voltage level of the input signal is decreased further, a control signal is provided to variable phase shifter 110 to further increase its delay time interval. The measuring device 116 continuously monitors the input voltage level (or the pulse width modulation of the input voltage level) and automatically provides a control signal indicating a change in a predetermined delay time interval of signal passing through variable phase shifter 110. Variable phase shifter 110 responds to the indications from measuring device 116 by appropriately changing its delay time interval.

Sampler circuit 112 is provided a sampling clock signal (designated herein as "fclk"). The output of the sampler circuit 112 is the voltage level on its input held and delayed by up to one fclk period.

Comparator circuit 114 determines when the voltage level on its input has reached a predetermined threshold voltage or reference voltage level. Upon the voltage level on circuit 114 input reaching that level, comparator circuit 114 generates a digital indication, e.g. comparator circuit 114 generates a digital 1. Upon the voltage level on comparator circuit's 114 input dropping below the threshold or reference voltage level, comparator circuit 114 digitally indicates that the voltage level is below the reference level, e.g. comparator circuit 114 generates a digital 0.

Figure 2:
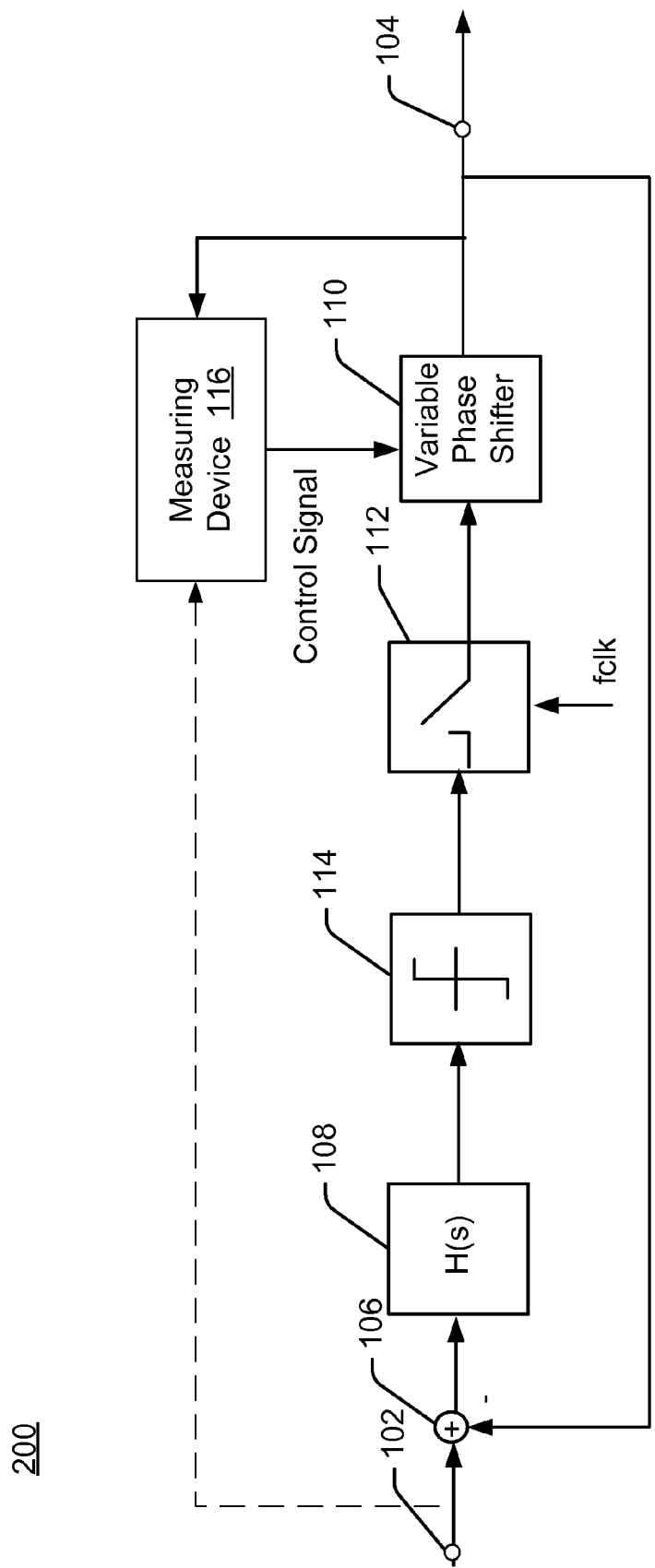
FIG. 2 is a simplified schematic diagram of one embodiment of an analog to digital converter with a variable phase shifter 110 as the final stage of the ADC.

FIG. 2 shows an implementation of an ADC 200, which is shown with an input terminal 102 and output terminal 104. Connected in series between the terminals 102-104 are combiner circuit 106, device 108, comparator circuit 114, sampler circuit 112 and variable phase shifter 110. The variable phase shifter 110 is shown in the last stage of ADC 200 with its output being fed to output terminal 104 and being fed to the inverting input of combiner circuit 106. Measuring device 116 either monitors the analog input signal on input terminal 102 or the corresponding pulse width modulated digital output signal from variable phase shifter 110 fed to output terminal 104. In response to whether the level of input signal has exceeded one or more predetermined threshold levels, measuring device 116 provides a control signal to variable phase shifter 110. Variable phase shifter 110 changes its predetermined delay time interval in response to the control signal.

FIG. 3 shows an implementation of an ADC 300, which is shown with the an input terminal 102 and output terminal 104. Connected in series between the terminals 102-104 are combiner circuit 106, device 108, comparator circuit 114, variable phase shifter 110 and sampler circuit 112. The sampler circuit 112 is the last stage of ADC 300 with its output being fed to output terminal 104 and the inverting input of combiner circuit 106. Measuring device 116 monitors either the analog input signal on input terminal 102 or the corresponding pulse width modulated digital output signal from sampler circuit 112 fed to output terminal 104. In response to whether the voltage level of input signal has exceeded one or more predetermined threshold voltage levels, measuring device 116 provides a control signal to variable phase shifter 110. Variable phase shifter 110 changes its predetermined delay time interval in response to the control signal.

FIG. 4 shows another implementation of an ADC 400, shown with input terminal 102 and output terminal 104. Connected in series between the terminals 102-104 are combiner circuit 106, device 108, variable phase shifter 110, comparator circuit 114 and sampler circuit 112. In ADC 400, the sampler circuit 112 is disposed in the last stage and its output is fed to output terminal 104. However, the output of the comparator circuit 114 is fed to the input of sampler circuit 112 and the inverting input of combiner circuit 106. Measuring device 116 either monitors the analog input signal on terminal 102 or the corresponding pulse width modulated digital output signal fed to sampler circuit 112. In response to the voltage level of input signal exceeding one or more predetermined threshold voltage levels, measuring device 116 provides a control signal to variable phase shifter 110. Variable phase shifter 110 changes its predetermined delay time interval in response to the control signal.

Figure 5:
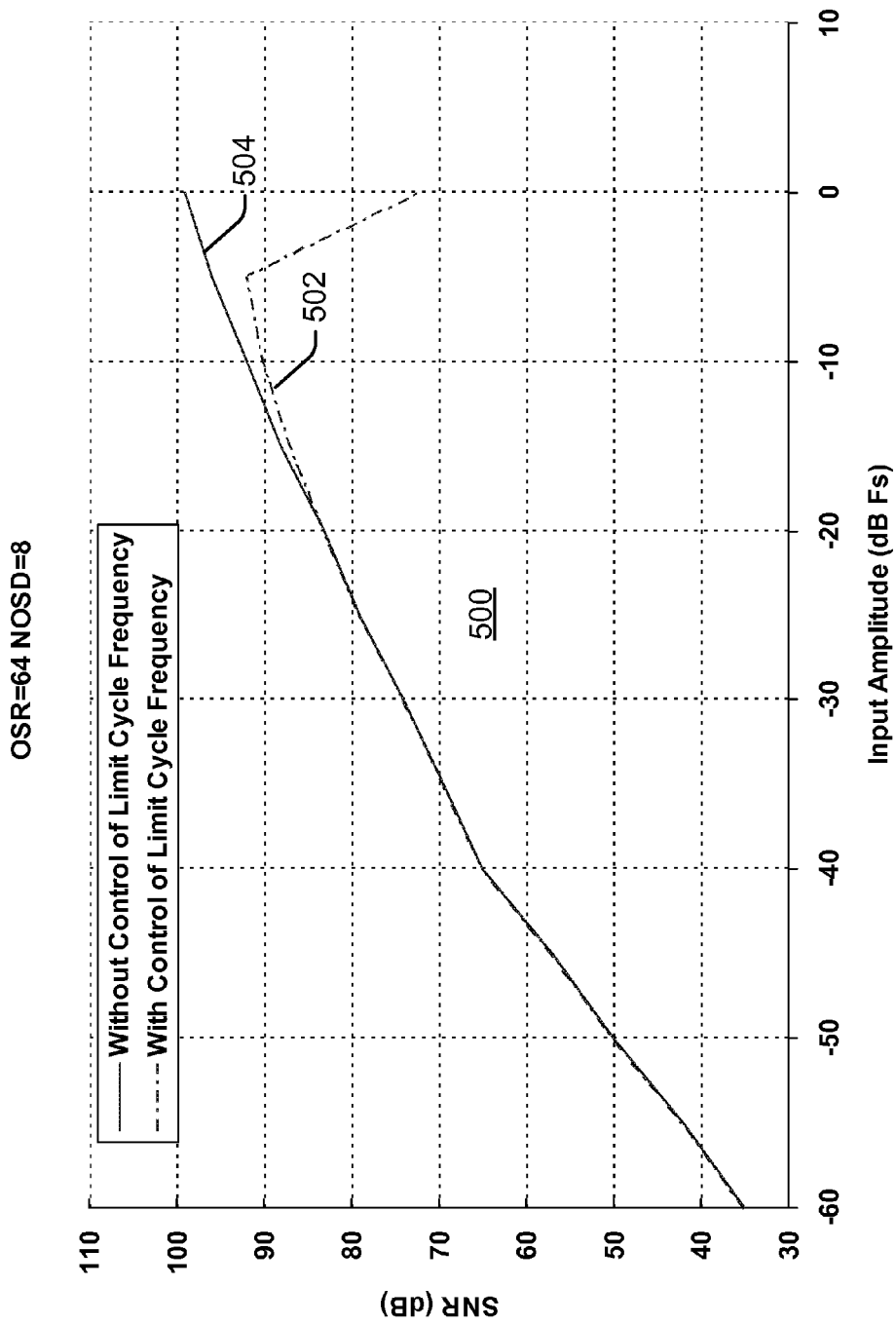
FIG. 5 is a graph illustrating the signal to noise ratio of an ADC output as a function of the ADC input signal amplitude with and without the ADC's limit cycle frequency being controlled.

FIG. 5 shows a graph 500 of the signal to noise ratio (SNR) of an ADC output as a function of the ADC input signal amplitude with and without the ADC limit cycle frequency being controlled. Line 502 represents the SNR vs. the input amplitude without any control of the limit cycle frequency. Line 504 represents the SNR vs. the input amplitude with control of the limit cycle frequency. Both of these lines were determined using the ADC shown in FIG. 3, with the OSR=64 and the NOSD=8, where OSR is the ratio between the limit cycle frequency and bandwidth of the transmission system, and NOSD is the ratio between the sampling frequency and the limit cycle frequency. As shown by line 502, the SNR increases once the amplitude reaches a predetermined level (e.g. −5 db). However, with the control of the limit cycle frequency, the SNR does not increase at the same input amplitude, thus extending the dynamic range of the ADC.

Although the ADC systems or devices are shown as having one variable phase shifter 110, this implementation is meant to serve only as a non-limiting example and may include multiple phase shifters or multiple measuring devices.

Exemplary Process

Figure 6:
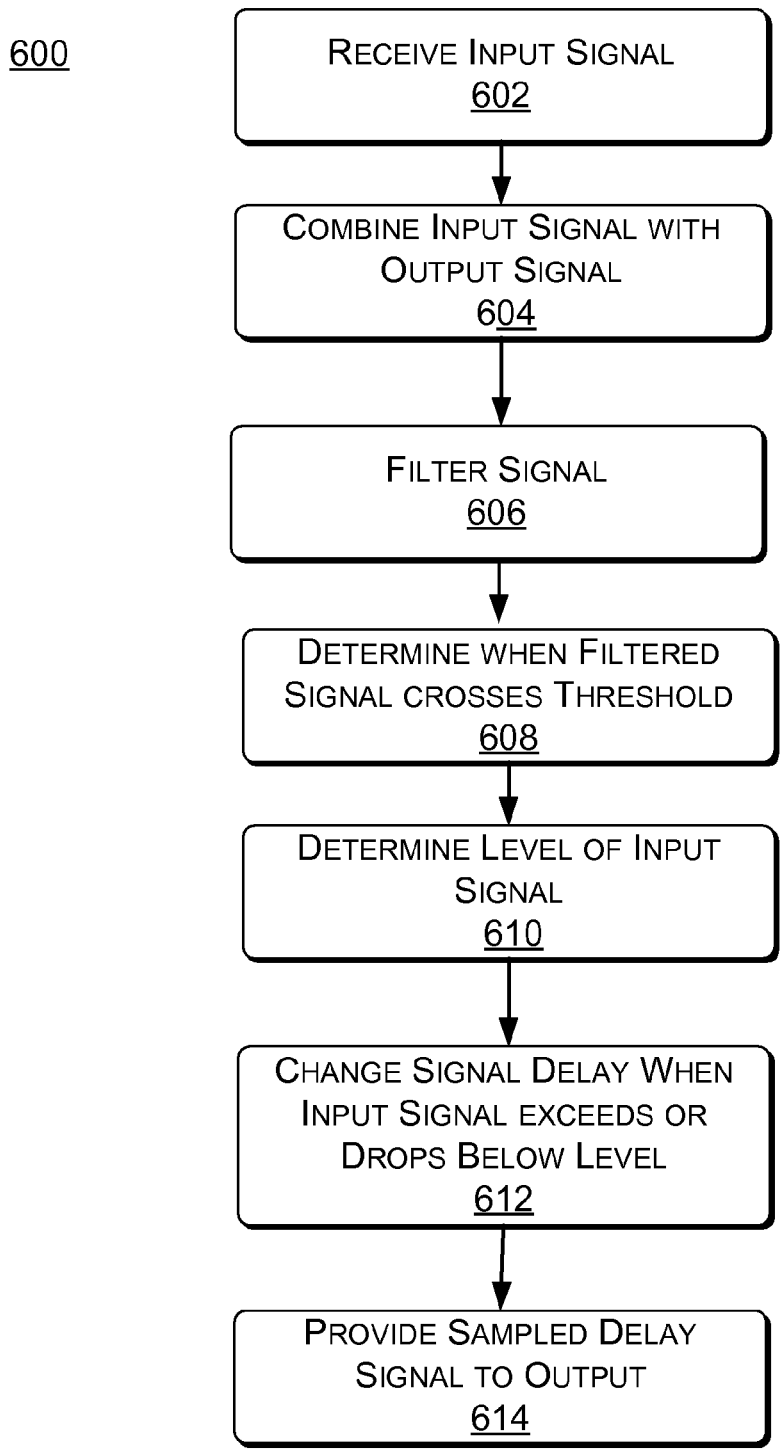
FIG. 6 is a flow diagram of a process for increasing the dynamic range of the pulse width modulation using the exemplary ADC shown in FIG. 3.

FIG. 6 shows one example implementation of a process 600 for increasing the dynamic range of pulse modulation in an analog to digital converter.

Specifics of exemplary methods are described below. However, it should be understood that certain acts need not be performed in the order described, and may be modified, and/or may be omitted entirely, depending on the circumstances. Moreover, the acts described may be implemented by a computer, processor or other computing device based on instructions stored on one or more computer-readable media. The computer-readable media can be any available media that can be accessed by a computing device to implement the instructions stored thereon.

The system in FIG. 3 may be used for reference in describing one aspect of providing increased dynamic range of pulse modulation in the ADC 300. At block 602, an input signal is received. The input signal may be received on input terminal 102. At block 604, the input signal is combined with the output signal. The signals may be combined at output terminal 104. At block 606, the combined signal is filtered to remove high frequencies from the combined signal. At block 608, a determination is made when the filtered signal crosses a predetermined threshold voltage level. This determination may be made by a comparator circuit 114. A digital indication is provided by comparator circuit 114 when comparator circuits detects that a voltage level of the filtered signal crosses the threshold or reference voltage level. At block 610, a determination is made as to the level of the input signal on input terminal 102. This determination is made by the measuring device 116 either examining the analog input signal or determining the input voltage from the pulse modulated signal on the output terminal 104.

At block 612, the signal delay is changed when the analog input signal exceeds or drops below a predetermined level. Specifically, the measuring device 116 transmits a control signal to the variable phase shifter 110 to change the signal delay time when the input signal exceeds or falls below a predetermined level. For example, if the voltage level of the input signal exceeds a first threshold voltage level, the variable phase shifter 110 would receive a signal from the measuring device 116 to decrease its predetermined delay time interval. If the voltage level of the input signal then exceeds a second threshold voltage level, the variable phase shifter 110 would receive a signal from the measuring device 116 to further decrease its predetermined delay time interval.

On the other hand, if the voltage level of the input signal drops below a threshold voltage level, the variable phase shifter 110 would receive a control signal from the measuring device 116 to increase its predetermined delay time interval. At block 612, the delayed signal is then sampled using sampler circuit 112 and fed to the output terminal 104 and the combiner circuit 106.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. For the purposes of this disclosure and the claims that follow, the terms "coupled" and "connected" have been used to describe how various elements interface. Such described interfacing of various elements may be either direct or indirect.

The invention claimed is:

1. An analog to digital converter circuit comprising:
an input terminal to receive an analog input signal;
an output terminal; and
a plurality of stages connected in series, each stage to receive an input signal and an output signal, the output signal of the last stage to be provided to the output terminal, being a digital signal, and indicating a level of the analog input signal, the output signal of the last stage to be combined with the received analog input signal on the input terminal, the combined signal to be fed to a first of said plurality of stages, a measuring device coupled with the output terminal to determine when a level indicated by the output signal of the last stage exceeds a first predetermined level and to determine when the level indicated by the output signal of the last stage exceeds a second predetermined level, at least one of the plurality of stages comprising a variable delay stage to generate a time delayed signal by delaying its input signal a first predetermined time interval when the measuring device determines a level indicated by the output signal of the last stage exceeds a first predetermined level and by delaying its input signal a second predetermined time interval when the measuring device determines the level indicated by the output signal of the last stage exceeds a second predetermined level.

2. An analog to digital converter circuit as recited in claim 1, further comprising a comparator stage to indicate when the level of the output signal of the last stage exceeds a third predetermined level.

3. An analog to digital converter circuit as recited in claim 1, further comprising a measurement stage to indicate when its input signal exceeds the first and second predetermined level, wherein the variable delay stage, in response to the indication by the measurement circuit, delays its input signal a first predetermined time interval when the output signal of the last stage exceeds the first predetermined level and delays its input signal the second predetermined time interval when the output signal of the last stage exceeds the second predetermined level.

4. An analog to digital converter circuit as recited in claim 1, further comprising a low pass filter stage to attenuate signals exceeding a predetermined frequency.

5. An analog to digital converter circuit as recited in claim 1, further comprising a sampler stage to generate a signal at a periodic clock interval corresponding to a sample of an output signal of the previous stage.

6. An analog to digital converter circuit as recited in claim 1, wherein the second level is greater than the first level, and wherein the second predetermined time interval is less than the first predetermined time interval.

7. An analog to digital converter circuit as recited in claim 1, wherein the variable delay stage receives an indication when a level of the analog input signal exceeds the first predetermined level or the second predetermined level by analyzing a digital output signal on the output terminal.

8. In a pulse width modulated analog to digital converter circuit, a device comprising:
a plurality of stages connected in series, each stage to receive an input signal and to generate an output signal, the output signal of a last stage being a digital signal and indicating a level of the output signal, the digital output signal of the last stage to be provided to an output terminal and to be combined with a received analog input signal on the input terminal, the combined signal to be fed to a first of said stages, the stages comprising:
a filter stage comprising a low pass filter that receives the combined signal and generates an output comprising the combined signal with attenuated signals exceeding a predetermined frequency;
a comparator stage comprising a comparator to generate a pulse indicating when the output signal from the previous stage exceeds a first predetermined level;
a sampler stage to generate a signal at a periodic clock interval corresponding to a sample of the output signal of the previous stage;

a measurement circuit to detect when the level indicated by the digital output signal of the last stage exceeds a second and a third predetermined level and to indicate when the level indicated by the digital output signal of the last stage exceeds the second and the third predetermined level; and a variable delay stage to receive indications from the measurement circuit and to delay the output signal from the previous stage a first predetermined time interval when receiving an indication that the level of the digital output signal of the last stage exceeds a second predetermined level and to delay the output signal provided by the previous stage a second predetermined time interval when receiving an indication that the level of the digital output signal of the last stage exceeds a third predetermined level in response to the indication by the measurement circuit.

9. A device as recited in claim 8, wherein the output signal of the filter stage is fed to the comparator stage.

10. A device as recited in claim 8, wherein the output signal from the filter stage is to be fed to the variable delay stage.

11. A device as recited in claim 10, wherein the output signal from the variable delay stage is to be fed to the comparator stage.

12. A device as recited in claim 11, wherein the output signal of the comparator stage is fed to the input of the sampler stage.

13. A device as recited in claim 12, wherein the output signal from the sampler stage is a pulse width modulated digital output signal, and wherein the pulse width modulated digital output signal is to be fed to the output terminal and is to be combined with the analog input signal and fed to the filter stage.

14. A method comprising adjusting a limit cycle frequency of a pulse width modulation in an analog to digital converter as a function of an input analog signal level, wherein the limit cycle frequency is adjusted by delaying the input analog signal a first predetermined time interval when a level of the input analog signal exceeds a first predetermined level, and wherein the limit cycle frequency is adjusted by delaying the input analog signal a second predetermined time interval when the level of the analog input signal exceeds a second predetermined level.

15. A method as recited in claim 14, further comprising indicating with a comparator when the analog input signal exceeds a third predetermined level.

16. A method as recited in claim 14, further comprising:
indicating when the analog input signal exceeds the first and second predetermined level;
delaying the analog input signal a first predetermined time interval when the analog input signal exceeds the first predetermined level; and
delaying the analog input signal the second predetermined time interval when the analog input signal exceeds the second predetermined level in response to the indication.

17. A method as recited in claim 14, wherein the second level is greater than the first level, and wherein the second predetermined time interval is less than the first predetermined time interval.

18. A method as recited in claim 14, wherein the analog to digital converter generates a digital output signal, and wherein the method further comprises determining when a level of the analog input signal exceeds the first predetermined level or the second predetermined level by analyzing the digital output signal.

19. A method as recited in claim 14, further comprising:
coupling, in the analog to digital converter, a plurality of stages in series, wherein each stage receives an input signal and provides an output signal;
coupling the output signal from the last stage to an output terminal;
combining the received input analog signal with the output signal from the last stage; and
feeding the combined signal to a first of said plurality of stages.

* * * * *